(12) United States Patent
Fonfara et al.

(10) Patent No.: US 7,508,669 B2
(45) Date of Patent: Mar. 24, 2009

(54) COOLING DEVICE FOR AN ELECTRONIC COMPONENT, ESPECIALLY FOR A MICROPROCESSOR

(75) Inventors: Harald Fonfara, Lalling (DE); Herbert Göstl, Zwiesel (DE); Thorsten Miltkau, Deggendorf (DE); Markus Eberl, Otzing (DE); Ralf Mollik, Metten (DE)

(73) Assignee: Liebert Corporation, Columbus, OH (US)

( * ) Notice: Subject to any disclaimer, the term of this patent is extended or adjusted under 35 U.S.C. 154(b) by 211 days.

(21) Appl. No.: 10/566,797

(22) PCT Filed: Jun. 28, 2004

(86) PCT No.: PCT/DE2004/001361

§ 371 (c)(1),
(2), (4) Date: Mar. 12, 2007

(87) PCT Pub. No.: WO2005/015970

PCT Pub. Date: Feb. 17, 2005

(65) Prior Publication Data

US 2007/0274044 A1    Nov. 29, 2007

(30) Foreign Application Priority Data

Jul. 30, 2003   (DE) ................. 103 35 197

(51) Int. Cl.
*H05K 7/20*  (2006.01)
(52) U.S. Cl. ............... 361/699; 361/698; 361/702; 361/703; 361/710
(58) Field of Classification Search ............ 361/698, 361/699, 702, 703, 710
See application file for complete search history.

(56) References Cited

U.S. PATENT DOCUMENTS

| | | | | |
|---|---|---|---|---|
| 4,698,728 A | * | 10/1987 | Tustaniwskyj et al. | 361/699 |
| 4,712,158 A | * | 12/1987 | Kikuchi et al. | 361/699 |
| 5,144,531 A | * | 9/1992 | Go et al. | 361/702 |
| 5,285,347 A | * | 2/1994 | Fox et al. | 361/699 |
| 5,388,635 A | * | 2/1995 | Gruber et al. | 165/80.4 |
| 5,982,616 A | | 11/1999 | Moore | |

(Continued)

FOREIGN PATENT DOCUMENTS

WO    WO 02/102124 A2 * 12/2002

*Primary Examiner*—Anatoly Vortman
(74) *Attorney, Agent, or Firm*—Harness, Dickey & Pierce, P.L.C.

(57) ABSTRACT

A cooling device (1) for an electronic component (3), especially for a microprocessor, includes a heat sink (7, 9), which can be connected to the electronic component (3) to be cooled, such that the waste heat generated by the electronic component (3) is transferred and transported away via a thermal interface of the electronic component (3) on the heat sink (7, 9). The heat sink (7, 9) comprises a first heat sink part (7), which is formed for connection to the electronic component, and a second heat sink part (9), which is connected detachably to the first heat sink part (7), such that a low heat transfer resistance is given, wherein at least the predominant part of the waste heat is transferred to a coolant via the second heat sink part (9). A rack may store several electronic components (3) to be cooled, wherein each electronic component to be cooled is included in a respective system such as respective server for a data-processing system. The electronic components (3) to be cooled are each equipped with a respective cooling device (1) which carries a flow of a liquid medium.

17 Claims, 5 Drawing Sheets

U.S. PATENT DOCUMENTS

| | | | |
|---|---|---|---|
| 6,205,803 B1 * | 3/2001 | Scaringe | 62/259.2 |
| 6,393,853 B1 * | 5/2002 | Vukovic et al. | 62/259.2 |
| 6,519,955 B2 * | 2/2003 | Marsala | 62/119 |
| 6,536,510 B2 * | 3/2003 | Khrustalev et al. | 165/104.33 |
| 6,587,336 B2 * | 7/2003 | Chu et al. | 361/687 |
| 6,657,121 B2 * | 12/2003 | Garner | 174/16.3 |
| 7,003,970 B2 * | 2/2006 | Iida et al. | 62/259.2 |
| 7,012,807 B2 * | 3/2006 | Chu et al. | 361/699 |
| 2002/0007641 A1 * | 1/2002 | Marsala | 62/119 |
| 2002/0021557 A1 | 2/2002 | Ishimine et al. | |
| 2003/0010477 A1 * | 1/2003 | Khrustalev et al. | 165/104.33 |
| 2003/0057546 A1 * | 3/2003 | Memory et al. | 257/706 |
| 2004/0037045 A1 * | 2/2004 | Phillips et al. | 361/719 |

* cited by examiner

COOLING DEVICE FOR AN ELECTRONIC COMPONENT, ESPECIALLY FOR A MICROPROCESSOR

TECHNICAL FIELD OF THE INVENTION

The invention relates to a cooling device using a liquid coolant for cooling an electronic component, especially a microprocessor. In addition, the invention relates to a rack for storing several electronic components, such as servers for data-processing systems.

BACKGROUND OF THE INVENTION

In large electronic data-processing systems, the individual electronic components, such as, for example, a plurality of servers, are stored in cabinets or racks, in order to guarantee an ordered installation and cabling of the individual components. In addition, the climate is controlled in racks or cabinets for such electronic components that is, the waste power generated by the components in the form of heat energy is dissipated with suitable means. In the following, the term rack is used both for closed cabinets and also for open shelves, in which the individual components are stored. The waste power is generated mainly by electronic parts of the individual components. In modern data-processing systems, the predominant portion of the waste power is generated by microprocessors. The waste power of a processor has been up to now on the order of magnitude of ca. 100 W. Waste power in this range was dissipated with processor fans, that is, a combination of a metallic heat sink and a fan component, from the processor into the interior of the housing of the server or the electronic components, from there into the interior of the (preferably closed) rack, and then to the outside air surrounding the rack. To this is added the waste power in the form of heat discharged from other assemblies and parts of the individual electronic components, such as power supply parts, drives, etc., that is, from a plurality of individual electronic components, which, taken by themselves, definitely discharge a relatively small amount of waste power, so that a separate cooling of these electronic components is not worthwhile, wherein these small waste powers can add up to values from 100 to 150 W and more per electronic component. Therefore, in addition to the processor fans, additional fans are usually necessary in order to dissipate all of the waste heat generated in the housing of the electronic component. For server racks, which can store up to 50 individual servers each possibly with several processors, a total waste power of 10 kW to 12.5 kW per rack is thus already generated.

For coming generations of electronic components, an increase of the heat waste power discharged by individual electronic components, such as microprocessors, from 150 to 200 W and more is expected. In a rack, for example, with up to 50 servers, including the additional waste power of 100 to 150 W per electronic component, this leads to a total waste power of up to 17.5 kW and more per rack. Such high waste powers in the form of heat can no longer be managed with reasonable expense just by air as the heat carrier medium.

For individual electronic components, such as servers, it is known to cool electronic components, especially microprocessors, which, by themselves, generate a large amount of waste power, by heat sinks carrying a flow of a liquid cooling medium, for example, water, instead of combinations of heat sinks and fans. Thus, only the heat waste power generated by the other assemblies and components that are not cooled individually must still be dissipated by means of air as the medium.

Both for cooling devices, which comprise a heat sink and a fan, and also for cooling devices with a heat sink carrying a flow of a liquid heat carrier medium, there is the problem that this must be mounted with the best possible heat conduction on the electronic component to be cooled, usually a component with a semiconductor chip. For guaranteeing good heat transfer, usually a heat-conductive paste is used between the thermal interface of the component and the heat sink. In addition, a sufficient contact pressure is necessary. If the heat sink has to be removed, for example, because the fan integrated into the heat sink is defective or because compactly arranged assemblies or parts must be manipulated within the narrow housing of the electronic component, then there is the risk, for each disassembly or assembly of the heat sink, that the sensitive electronic component could be damaged or destroyed.

If an electronic component is to be removed from a rack and replaced, and if a known cooling device is used for this electronic component with a liquid heat carrier medium or coolant, then either the supply lines for the coolant must be separated, preferably at connectors, or the entire cooling device must be removed from the electronic component to be cooled and the risk of damaging this component must be taken into account. However, when the supply lines are separated, there is also a considerable risk of damaging this electronic component or adjacent electronic components, even if only a small amount of coolant leaks out. This applies especially when the electronic component is to be replaced during the operation of the other electronic components (hot plugging).

Starting with this state of the art, the invention is based on the problem of creating a cooling device for an electronic component, especially for a microprocessor, in which the actual heat sink can be mounted and removed easily, quickly, and without the risk of damaging or destroying the electronic component to be cooled. In addition, the invention is based on the problem of creating a rack for storing several electronic components, such as servers for data-processing systems, under the use of such cooling devices, which are cooled by a liquid heat carrier medium.

SUMMARY OF THE INVENTION

The invention starts from the knowledge that, by means of a heat sink, which comprises a first heat sink part, which is formed for connecting to the electronic component, and a second heat sink part, which is connected detachably to the first heat sink part, such that a low resistance to heat transfer is given, wherein at least the predominant portion of the waste heat is transferred via the second heat sink part to a cooling medium, the advantage is achieved that for the first assembly of the cooling device, only the first heat sink part has to be thermally coupled and fixed to the electronic component to the cooled. This can even be performed by the manufacturer of the electronic component at the factory. In addition, the first heat sink part can also be mounted on the electronic component to be cooled by the manufacturer of this component. The first heat sink part can also be integrated with the housing of the electronic component, in particular, it can be connected permanently to this component.

The second heat sink part can then be connected with good heat conductivity to the first heat sink part without the risk of damaging the electronic component. If necessary, the second heat sink part can then be removed from the first heat sink part without a problem.

This advantage comes to light especially, but not exclusively, from the formation of the cooling device, in which the second heat sink is formed as a heat sink carrying a flow of liquid coolant. For this purpose, the second heat sink part has at least one channel, which carries a flow of a liquid coolant, for example, water. In addition, on the second heat sink part, there is a supply connection and a return connection, which are to be connected to at least one channel. If the electronic component including the electronic part to be cooled is to be replaced, then it is no longer necessary to either disassemble the entire heat sink (comprising the first and second heat sink parts) or to separate the supply lines for the coolant from the heat sink when the heat sink is left on the electronic component. Instead, just the second heat sink part can be separated easily and quickly from the first heat sink part and mounted, for example, on another first heat sink part, which is already mounted on the relevant electronic part to be cooled in a replacement electronic component.

According to the invention, the first heat sink part preferably comprises a contact surface for thermal connection to the second heat sink part, which has a structure for increasing the contact surface, wherein the contact surface of the first heat sink part interacts with a complementary contact surface of the second heat sink part. Here, the surface of thermal interface between the first and the second heat sink parts can be greater than the surface of the thermal interface between the electronic component to be cooled and the first heat sink part. Advantageously, the structure for increasing the contact surface between the first and second heat sink parts is provided in the (horizontal cross-sectional) area of the first heat sink part, in which the first heat sink part contacts the electronic component to be cooled, thus in the region of so-called hot spots (in plan view on the component or the cooling device).

According to one embodiment of the invention, the structures can be formed with at least one rib with beveled, preferably flat edges, and can preferably have a trapezoidal cross section. Such a structure has the advantage that extrusion molded parts that can be manufactured easily, with high precision, and economically, and can be used for realizing the second heat sink. In addition, the edge angle can be selected so that just through relatively low contact forces, which act on the second heat sink part in the direction towards the first heat sink part, a high surface pressure between the complementary structures of the first and the second heat sink parts is generated and thus a low heat transfer resistance is guaranteed.

This advantage obviously can be achieved not only with complementary rib-shaped structures, but also very generally with structures which have sub-areas inclined at a suitable angle relative to the direction of the contact force acting on the first heat sink part in the direction towards the first heat sink part. For example, a "hedgehog structure" can be used, in which a plurality of spike-like projections on the bottom side of the second heat sink part interact with a correspondingly complementary structure on the surface of the first heat sink part. The spike-like projections have correspondingly inclined outer surfaces.

According to one embodiment of the invention, channels for the coolant can be provided at least in the ribs of the contact surface of the second heat sink part. In this way there is the advantage that the flow or flows of the coolant lie close to the surface of the component to be cooled.

The channels can be arranged in the appropriate ribs, so that, through the provision of channels, relatively thin walls are created at least in essential regions of these ribs, which are in contact with corresponding complementary ribs of the first heat sink part. These walls can be dimensioned in terms of their thickness, depending on the material and the contact forces, so that they permit slight deformations due to contact forces, in order to guarantee the flattest possible contact of the outer sides of these walls on the complementary ribs of the first heat sink part and thus a good heat transfer.

According to a preferred embodiment, the second heat sink part can have, in the region of the supply connection and/or the return connection, a collection chamber, from which several channels for the coolant branch out or open into this chamber. In this way, a good heat transfer to the liquid coolant is achieved, because a larger surface can be reached than for a single channel possibly with a larger cross section. In addition, the middle region of the second heat sink can be realized with an extrusion molded part connected on opposing sides to a part forming the collection chamber and having the relevant supply or return connections.

The second heat sink part can have larger dimensions than the first heat sink part in at least one direction, with reference to the contact surface with the first heat sink part. In this way, there is the advantage that the position of the first heat sink part relative to the second heat sink part is not critical for the assembly of the second heat sink part on the first heat sink part. For example, for a formation of the structure increasing the contact surface in the form of ribs, the second heat sink part can be shifted slightly relative to the first heat sink part without additional means.

In addition, the second heat sink part can be formed so that an essentially uniform heat transfer with reference to the contact surface is possible by means of the coolant flow through the one or more channels in the contact surface with the first heat sink part. In particular, by forming several channels in a middle region of the second heat sink, these channels can be formed by all of the actual contact surfaces with the first heat sink part. With reference to the actual contact surface, possible collection chambers on one or both ends of this middle region can then lie outside this surface.

Also, only one or more cooling ribs each with at least one channel can be formed, which are located in the region of the so-called "hot spots" of the electronic component to be cooled. Through the one or more ribs and the provision of the channel or channels, such that they lie in the front region of the rib(s), the waste heat can be transferred to the coolant directly in the surroundings in which it is generated.

In one configuration of the invention, the first heat sink part can be formed as a heat pipe. A heat pipe transports heat guided by means of an evacuated vessel, e.g., a metal pipe, from one point to another. In the metal pipe itself, there is a relatively small volume of liquid, which can comprise distilled water as the predominant part (the remainder then consists of special additives, which optimize the heat transport). The liquid is under a low pressure, so that an evaporation temperature of about 30 degrees Celsius is realized. Only when the heat pipe is fed heat at one end, the water evaporates and transports the heat energy with very low loss to the cold end. There, the vapor condenses and transfers the heat accordingly. The condensed liquid flows back into the lower region of the vessel, whereby the circuit is closed.

By forming the first heat sink part as a heat pipe, the heat to be dissipated can be transported with extremely low loss to a position at which this heat is transferred by means of the second heat sink part to the coolant and can finally be dissipated. For example, the interface to the second heat sink part can be displaced to a position outside a housing, wherein the relevant end of the heat pipe can project through an opening in the housing. If the entire component is replaced, then the housing does not have to be opened. All that is required is to detach the second heat sink part from the first heat sink part.

A rack according to the invention for storing several electronic components, such as servers for data-processing systems, is formed for cooling electronic parts in the individual electronic components, wherein several cooling devices according to the invention are provided with a second heat sink part carrying a flow of a liquid coolant. The second heat sink parts of the cooling devices can be connected with their supply and return connections to one or more central coolant reservoirs or to one or more central heat exchangers, by means of which heat can be drawn from the coolant.

According to one embodiment, the one or more central coolant reservoirs or the one or more central heat exchangers can be arranged in or on the rack.

However, in the rack there can also be only one line system, which connects the supply connections of the cooling devices to one or more central supply connections of the rack and the return connections of the cooling devices to one or more central return connections of the rack.

According to one embodiment, there is at least one, preferably rigid supply riser, which is arranged fixed in the rack and which has several connections for preferably flexible connection lines from respectively one connection to a supply connection of a second heat sink part of a cooling device. In the same way, in the rack there is at least one, preferably rigid return riser, which is arranged fixed in the rack and which has several connections for preferably flexible connection lines from respectively one connection to a return connection of a second heat sink part of a cooling device.

These and other advantages and features of the invention will be apparent from the following description of the preferred embodiments considered along with the accompanying drawings.

DESCRIPTION OF PREFERRED EMBODIMENTS

Figure 1:
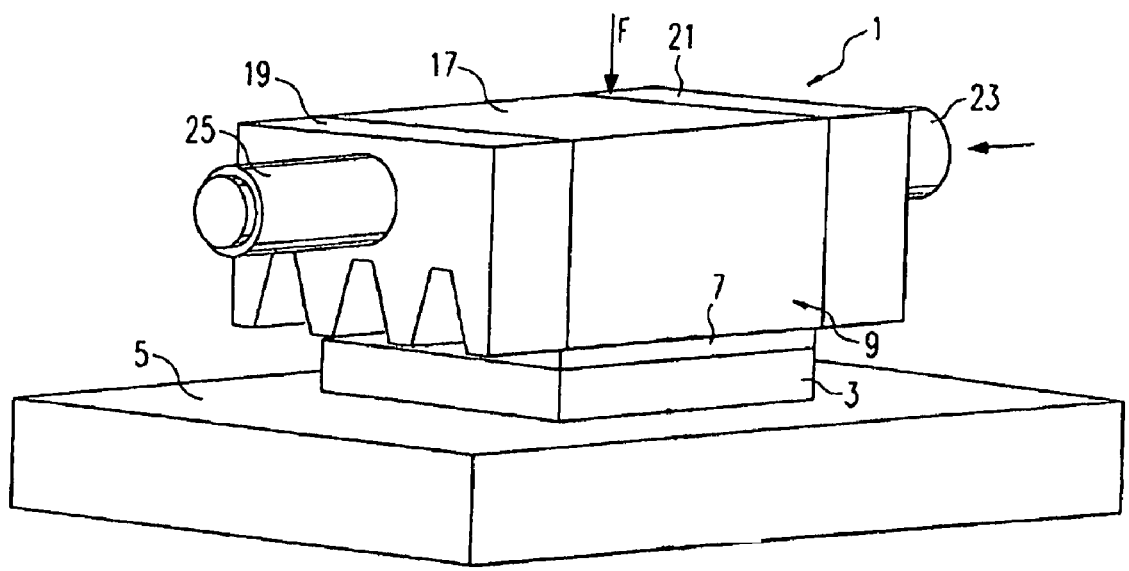
FIG. 1 is a perspective view of a cooling device embodying the principles of the present invention.
Figure 2:
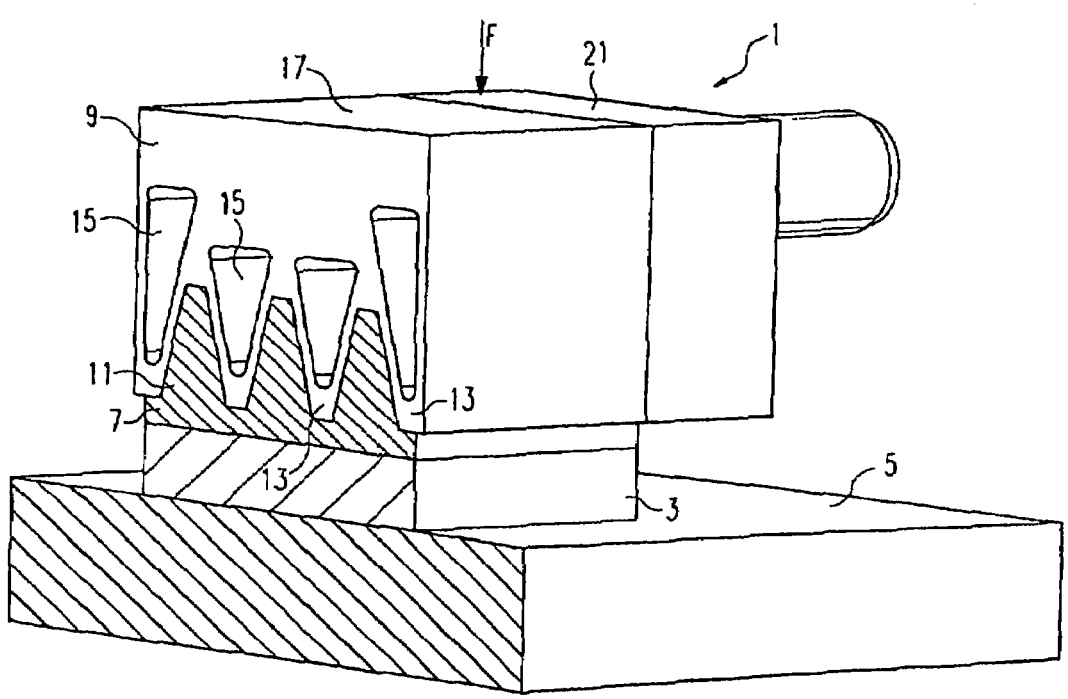
FIG. 2 is a perspective sectional view of the embodiment shown in FIG. 1.

FIG. 1 shows a cooling device 1 schematically in a perspective view, which is mounted on an electronic component part 3, for example, a microprocessor. On its side, the microprocessor 3 is arranged on a circuit board 5, which is only hinted at and on which obviously other components or assemblies can also be provided. The circuit board 5 can be, for example, a mainboard of a server. The cooling device 1 comprises a first heat sink part 7 made from a material with good heat conductivity, for example, aluminum or copper, which is connected with good heat conductivity directly to the housing or a thermal interface of the electronic component to be cooled. Here, it can be, for example, a heat sink plate (heat spreader) of a microprocessor or of the electronic component part 3. The first heat sink part 7 has a structure on its side facing away from the component part 3 in the form of ribs 11, which can have a trapezoidal cross section as shown in FIG. 2.

On the first heat sink part 7 there is a second heat sink part 9 made from a material with good heat conductivity, for example, aluminum or copper, and connected to this with good heat conductivity. For this purpose, the second heat sink part 9 is provided on its bottom side with a complementary structure in the form of ribs 13. In the ribs 13 there are channels 15 for a liquid coolant (not shown), which is carried through the channels 15 and which transports the waste power generated in the form of heat away from the electronic component part 3. The arrangement of channels 15 in the ribs offers the advantage that for correspondingly thin walls of the ribs 13, the coolant can be guided close to the surface of the component part 3, especially also between the ribs 11 of the first heat sink part 7.

The trapezoidal configuration of the ribs 11 and 13 also offers the advantage that a high contact pressure of the side surfaces of the trapezoidal ribs 11 and 13 is generated with a low contact force F, which acts on the second heat sink part 9 in the direction towards the first heat sink part 7, and consequently good thermal coupling can be guaranteed.

The extent (parallel to the upper surface of the component part 3) of the middle region 17 of the second heat sink part 9 with the ribs 13 is at least as large as the extent of the surface of the first heat sink part 7 with the ribs 11. In this way, for a corresponding arrangement and configuration of the channels 15, an essentially constant heat transfer resistance is achieved in the contact surface of the two heat sink parts 7 and 9—at least along lines parallel to the longitudinal direction of the ribs. A middle region 17 formed in this way also has the advantage that it can be manufactured from a highly precise and economical extrusion molded part. This also applies for the first heat sink part 7.

Each end region 19 or 21, which can be seen in FIGS. 1 and 2, respectively, and which connects respectively to the two ends of the middle region of the second heat sink part 9, can be identical in terms of outer contour to the middle region 17. However, in the interior of each of the end regions 19, 21, there is a collection chamber (not shown), which is connected to the channels 15. The regions 17, 19, 21 can obviously be formed integrally. For example, an end region 19, 21 can be manufactured so that from both sides, the inner walls between the channels 15 are removed partially or completely, for example, milled out, in the end regions of a corresponding extrusion molded part. The two-sided openings of the extrusion molded part can then be closed with corresponding covers, for example through soldering or the like.

A supply connection 23 for a supply line and a return connection 25 for a return line are provided on the ends of the regions 19, 21. The coolant is fed via the supply line to the cooling device 1 with a mass flow sufficient for cooling at the given (sufficiently low) temperature and discharged via the return line.

The assembly of the first heat sink part 7 on the electronic component part 3 can be realized in a conventional way by means of a suitable screw connection or by means of clamps or other suitable connection means. Obviously, for this purpose the first heat sink part can have attachment means, which are arranged, for example, on the side, and which can also project laterally over the surface of the component part 3. The fixing of the first heat sink part 7 on the component part 3 can be realized relative to the circuit board 5 or a not-shown housing of an electronic component 27 (FIG. 3), in which the circuit board 3 is arranged. However, the first heat sink part 7 can also be connected permanently to the component part 3, for example, through adhesion with a heat-conductive paste, or can even be formed integrally with the housing of the component 7.

The connection of the second heat sink part 9 to the first heat sink part 7 can also be realized by means of suitable, but in each case detachable connection means, for example, by screw connections, by means of fixing clamps or the like. The contact of the heat sink part 9 on the heat sink part 7 with sufficient pressure can also be realized by the placement and contact of a housing part of a housing of an electronic component 27, in which the circuit board 5 with the component part 3 to be cooled and the cooling device 1 arranged on this component is included.

This specific formation of the cooling device produces the advantage that the second heat sink part 9 acting as the actual heat sink can be detached from the first heat sink part 7 without having to detach the mechanically sensitive thermal interface between the component part 3 to be cooled and the first heat sink part.

Figure 3:
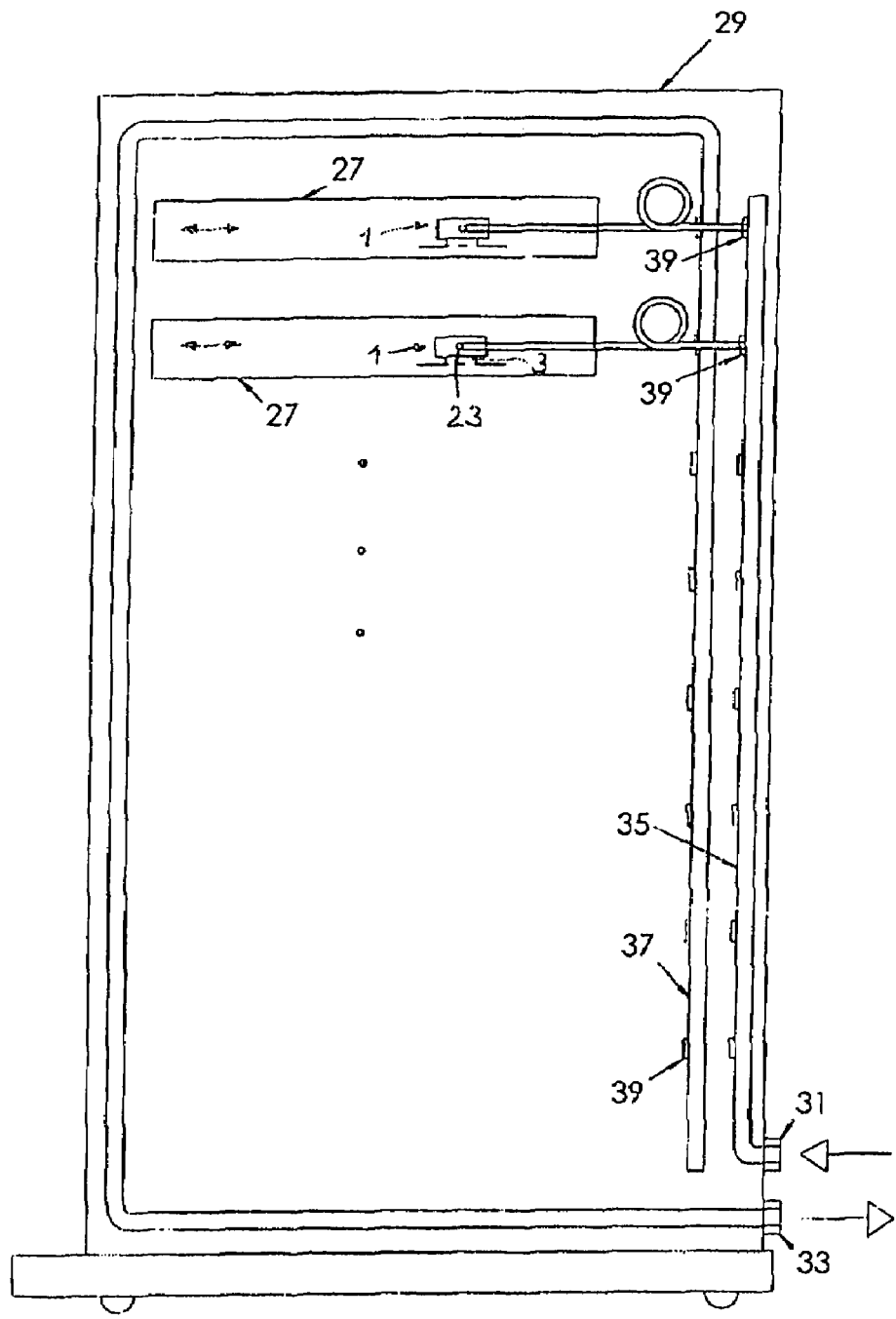
FIG. 3 is a diagrammatic representation of an electronic component rack embodying the principles of the present invention.

FIG. 3 shows a rack 29 schematically in a side view, in which a plurality of electronic components 27, for example, servers for a large EDV [electronic data-processing] system, can be stored. For reasons of simplicity, in FIG. 3 only two electronic components 27 are shown.

Each of the electronic components can have one or more component parts 3 to be cooled, which are cooled with a cooling device 1 according to the invention. Obviously, the remaining waste heat generated by an electronic component 27 can be dissipated in a conventional manner by means of fans into the interior of the rack 29 and from there to the surroundings.

For supplying the cooling devices 1 with a coolant, as shown in FIG. 3, a line system, which feeds the coolant from a central supply connection 31 of the rack 29 to the supply connections 23 of the individual cooling devices 1 and feeds coolant from the return connections 25 of the individual cooling devices 1 to a central return connection 33 of the rack 29, can be arranged in the rack. The coolant can be fed to the central supply connection 31 of the rack 29 from a central cooling device (not shown) and can be returned to this device by the central return connection 33 of the rack 29.

Obviously, it is not absolutely necessary to connect all of the cooling devices 1 individually in parallel between the central supply and the central return of the rack 29. Instead, several or all of the cooling devices 1 can be connected in series if the temperature of the coolant after leaving the input-connected cooling device 1 and the appropriate mass flow of the coolant permits this arrangement. Especially for the case in which several cooling devices 1 are provided in an electronic component, these cooling devices can be connected in series.

As shown in FIG. 3, the line system arranged in the rack can comprise a supply riser 35, which leads the coolant from the central supply connection 31 of the rack 29 to individual connections 39, which are each connected or can be connected to a supply connection 23 of a cooling device 1. The supply riser can comprise a rigid line connected rigidly to the rack. The lines between the connections 39 and the corresponding supply connection 23 of the related cooling device 1 can be flexible and have, if necessary, a sufficient excess length. This enables the affected electronic component 27 to be removed from rack, for example, in order to open its housing and to perform repairs or to replace components, without having to separate the cooling device(s) 1 of the electronic component from the remaining line system.

In the same way, there can be an analogously formed return riser 37, which also has connections 39 for connection lines (not shown) between the return connections 25 of each cooling device 1 and the return riser 37. These connection lines can also be flexible and have a sufficient excess length.

As shown in FIG. 3, the risers 35 and 37 are formed and connected so that for each electronic component 27 or the cooling devices 1 arranged in the component (more precisely: for the partial flow of the coolant through cooling devices related to this component), the same line length is produced between the supply connection 31 and the return connection 33. This is achieved for the embodiment shown in FIG. 3 such that the actual riser regions of the risers 35, 37 run preferably essentially in parallel and in each case the connections 39 of the supply riser 35 and the return riser 37 are arranged so that the sum of the line length between the supply connection 31 and the related connection 39 of the supply riser 35 and the line length between the related connection 39 of the return riser 37 and the return connection 33 for all the electronic components or all the pairs of "associated" connections 39 of the supply riser 35 and the return riser 37 is essentially constant. If the actual riser regions running in the vertical direction in FIG. 3 for the supply and return risers 35, 37 are parallel, then for this purpose the "associated" connections 39 can be provided essentially at the same height, preferably each at the height, at which the electronic component 27 to be connected is held in the rack 29.

In another not-shown embodiment, a central heat exchanger or a device for transferring the heat energy stored by the coolant to the surrounding air can also be provided in the rack itself.

This embodiment can also have central risers for the supply and the return according to FIG. 3. Then, however, the connections for the central supply and the central return do not have to be guided outwards, but instead can be connected to the central heat exchanger or the device for dissipating the heat energy stored by the coolant.

A rack formed in this way offers the advantage that an entire electronic component can be replaced without having to separate the cooling device from the cooling circuit. Only the second or every second heat sink part 9 has to be detached from the affected first heat sink part 7. The replacement component, which already has the preassembled first heat sink part or parts 7, can then be simply pushed into the rack. Only the second heat sink parts 9 must be reconnected to the relevant first heat sink parts 7. There is no risk of coolant leaking at the coupling point due to separation of a coolant line and in this way damaging one or more electronic components. In this way, in particular, very safe hot plugging of electronic components can be guaranteed.

Figure 4:
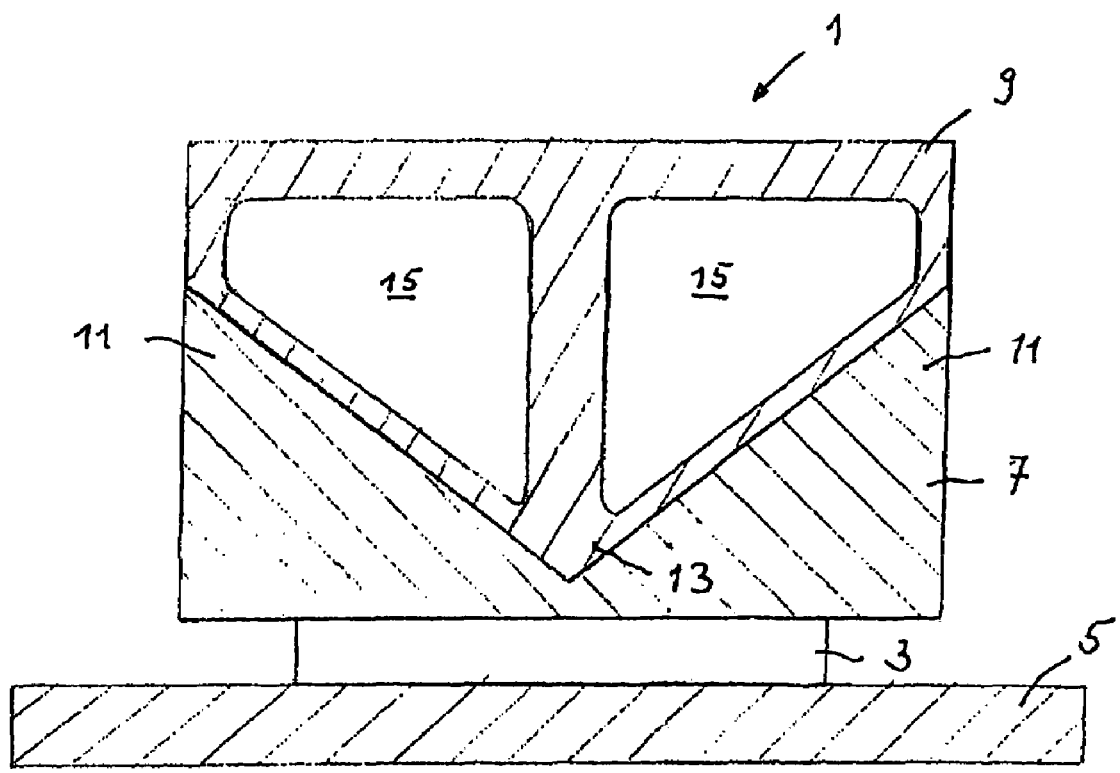
FIG. 4 is a partial sectional view of another embodiment of a cooling device according to the present invention.

FIG. 4 shows another embodiment for realizing a cooling device 1 comprising a first heat sink part 7 and a second heat sink part 9. Different from the embodiment shown in FIGS. 1 and 2, in which the second heat sink part 9 has four ribs extending downwards, the second heat sink part 9 of the embodiment shown in FIG. 4 only has a single rib 13 extending downwards. This rib 13 engages in a recess formed between two upwards extending ribs 11 of the first heat sink part 7 and is formed essentially complementary to this recess. In this way, a reduced heat transfer surface between the heat sink parts 7 and 9 is definitely produced in comparison with the embodiment according to FIGS. 1 and 2, but the single V-shaped rib 13 of the second heat sink part 9 and the V-shaped recess between the two ribs 11 of the first heat sink part are significantly easier to produce. The tolerances to be maintained in order to achieve a planar heat contact between the heat sink parts 7, 9 are much less critical than in the embodiment according to FIGS. 1 and 2. At this point, it should be noted that it is more advantageous for reasons of production to provide a few less ribs 13 or 11 on the second or on the first heat sink part, e.g., a maximum of four to six ribs 13 on the second heat sink part and three to five ribs 11 on the first heat sink part, which each extend into the other heat sink part for a greater height, than a plurality of ribs with a smaller height.

The second heat sink part 9 of the embodiment of a cooling device according to FIG. 4 comprises two channels 15 for guiding the coolant in the rib 13 of the second heat sink part 9. However, instead of this, only a single, preferably central channel or several channels can also be provided.

In addition, the cross section of the first heat sink part 7 can also be exchanged with the cross section of the second heat sink part 9 even to the channels 15 (not shown embodiment). That is, the first heat sink part 7 can have a single projection 11, which extends upwards and which engages in a recess formed between two projections 13 extending downwards. Here, one or more channels 15 can be formed in each of the projections 13 of the second heat sink part.

In general, it is advantageous to select the dimensions of the first and second heat sink part 7, 9 in plan view to be greater than the surface to be cooled of the electronic component part 3 to be cooled in order to create a larger surface for the heat transfer from the first heat sink part 7 onto the second heat sink part 9 and from the second heat sink part onto the coolant guided in this part.

Figure 5:
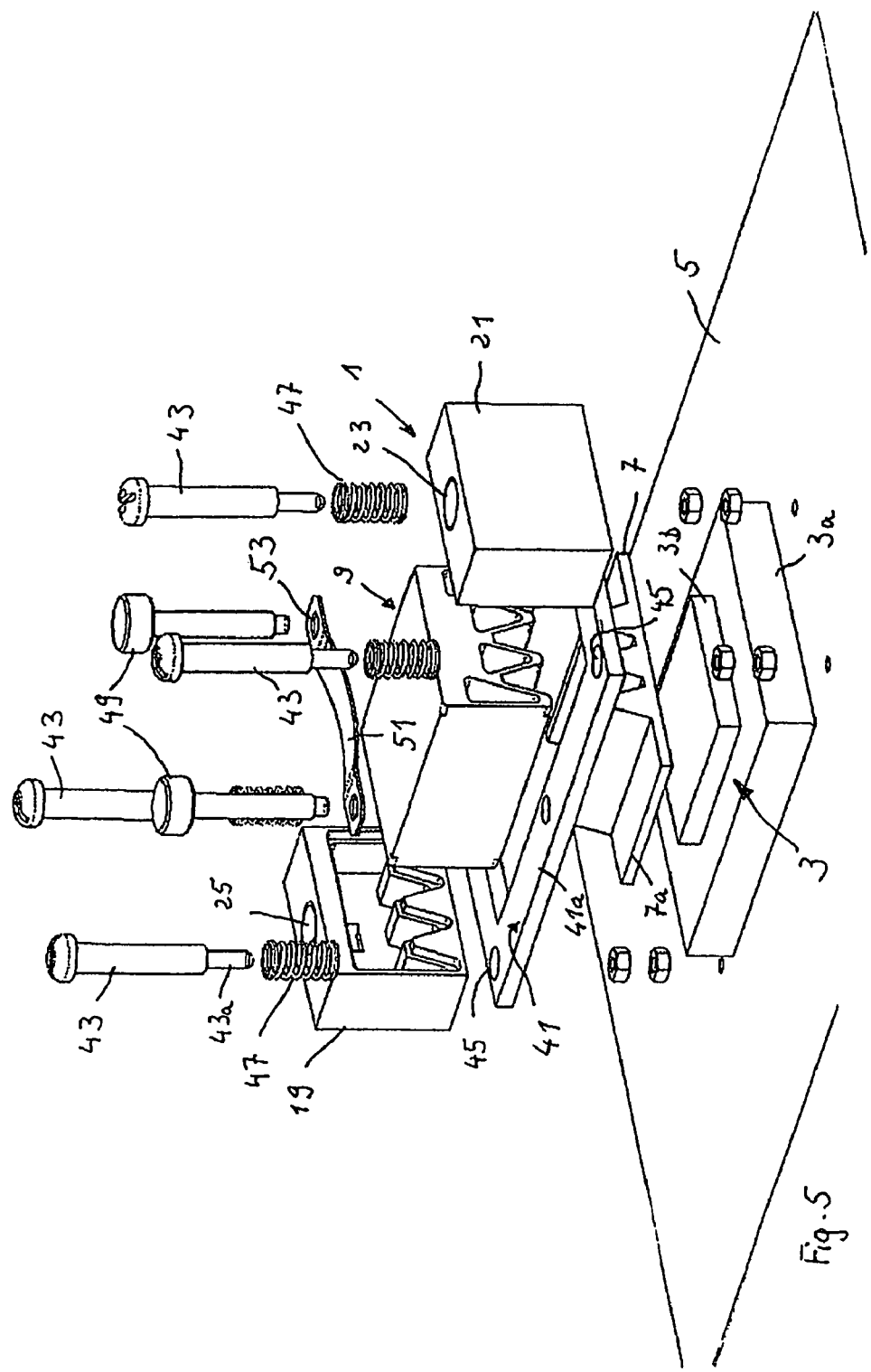
FIG. 5 is an exploded perspective view of a cooling device and mounting arrangement according to another preferred form of the present invention.

FIG. 5 shows another embodiment of a cooling device 1 in a perspective exploded view, which is similar to the embodiment according to FIGS. 1 and 2. Relative to the embodiment according to FIGS. 1 and 2, however, the supply and return connections 23, 25 project upwards at the end regions 23, 21.

In addition, FIG. 5 shows an advantageous possibility for assembly of the first heat sink part 7 in heat-conductive contact with the electronic component part 3 to be cooled. This component can comprise a housing 3a, on whose top side the region 3b of the semiconductor chip to be cooled is provided.

As shown in FIG. 5, the first heat sink part 7 can be held by means of a frame 41, whose parallel longitudinal sides 41a exert a force with their bottom sides on regions 7a of the first heat sink part 7, which extend outwards in the direction perpendicular to the profile of the ribs 11. In each of the corner areas of the frame 41 there is a bore hole 45 for an attachment screw 43. The attachment screws 43 pass through the bore holes 45 with their threaded area 43a and hold a helical spring 47 in their shaft area between the top side of the frame 41 and the bottom side of the corresponding screw head. The length of the shaft area of the attachment screws 43 and the length and the spring constant of the helical springs 47 are adapted to each other so that in the mounting of the frame 41, for attaching the frame 41 to the first heat sink part 7, the frame 41 is pressed by a bias of the helical springs 47 with a defined spring force onto the electronic component part 3 to be cooled. Thus, in a conventional way, a heat-conductive paste or a heat-conductive adhesive can be used between the topside of the component part 3 and the bottom side of the first heat sink part 7.

Then the second heat sink part 9 can be mounted by means of two additional attachment screws 49 and a spring-like retaining clamp 51 on the frame 41 mounted in this way and the first heat sink part 7 held by it. The attachment screws 49 pass through the retaining clamp, which preferably extends perpendicular to the profile of the ribs 11 and 13 of the first and second heat sink parts 7 and 9, respectively, in bore holes 53, which are provided in the end regions of the retaining clamp 51, and engage in threaded bore holes in the longitudinal sides 41a of the frame 41. The retaining clamp is preferably arranged in the center relative to the length of the second heat sink part and the frame 41.

The length of the attachment screws 49 and the spring-like end regions of the retaining clamp 51 are adapted to each other so that, after the attachment screws 49 have been screwed into the frame 41, the retaining clamp 51 exerts a force on the top side of the second heat sink part 9 with a defined force, which is sufficient to fix the second heat sink part 9 in a sufficiently stable attachment and a sufficiently good heat transfer onto the first heat sink part.

Obviously, this mounting device can also be used with each of the previously described embodiments of a cooling device.

In this way, an essential goal and an essential advantage of the present invention is realized in a simple way, namely creating a cooling device—including a suitable mounting device—in which the cooling device 1 or the second heat sink part can be separated from the first heat sink part in a simple way without requiring direct manipulations of the critical— since it is sensitive—interface between the electronic component part 3 and the cooling device 1. In this way, especially for cooling devices with a liquid coolant, the advantage is achieved that, for example, for maintenance or repair work on the circuit board, for which the circuit board must be removed from the device, the coolant circuit does not have to be separated and also the interface between the component part 3 and the cooling device does not have to be touched or separated.

The invention claimed is:

1. A cooling device for an electronic component, the cooling device including:
   (a) a first heat sink part having a component surface adapted to be placed in a heat transfer relationship with the electronic component;
   (b) a second heat sink part adapted to be placed together with the first heat sink part in an operating position;
   (c) one or more first projections making up a contact surface of the first heat sink part, and one or more second projections making up a contact surface of the second heat sink part, wherein the contact surface of the first heat sink part is adapted to mate with the contact surface of the second heat sink part with the one or more first projections interdigited with the one or more second projections when the first heat sink part and the second heat sink part are placed together in the operating position;
   (d) one or more channels formed in the second heat sink part at least partially through one or more of the second projections for carrying a flow of liquid coolant there through; and
   (e) a supply connection and a return connection included with the second heat sink part, wherein both the supply connection and the return connection are in fluid communication with the one or more channels.

2. The cooling device of claim 1 wherein the first projections and the second projections have beveled, flat sides and a trapezoidal cross section.

3. The cooling device of claim 2 wherein the first projections comprise first ribs extending laterally across the first heat sink part and the second projections comprise second ribs extending laterally across the second heat sink part.

4. The cooling device of claim 1 wherein the second heat sink part includes two or more channels and has in the region of the supply connection or the return connection a collection chamber in fluid communication with the two or more channels.

5. The cooling device of claim 1 wherein the contact surface of the second heat sink part is larger than the contact surface of the first heat sink part in at least one lateral dimension and wherein the first projections and the second projections are formed so that the first heat sink part and the second heat sink part may be placed together in multiple different operating positions with the first projections interdigited with the second projections.

6. The cooling device of claim 1 wherein the first heat sink part is formed as a heat pipe.

7. The cooling device of claim 1 further including a first attachment arrangement for detachably connecting the first heat sink part to the electronic component to be cooled.

8. The cooling device of claim 7 further including a second attachment arrangement for detachably connecting the second heat sink part to the first heat sink part independent of the first attachment arrangement so that if the second heat sink part is detached from the first heat sink part, the first heat sink part may remain connected to the electronic component via the first attachment arrangement.

9. An electronic component cooling system including:
(a) a rack for storing several electronic systems, each electronic system including one or more electronic components to be cooled; and
(b) for each electronic component to be cooled, a cooling device including,
  (i) a first heat sink part having a component surface adapted to be placed in a heat transfer relationship with the electronic component;
  (ii) a second heat sink part adapted to be placed together with the first heat sink part in an operating position;
  (iii) one or more first projections making up a contact surface of the first heat sink part, and one or more second projections making up a contact surface of the second heat sink part, wherein the contact surface of the first heat sink part is adapted to mate with the contact surface of the second heat sink part with the one or more first projections interdigited with the one or more second projections when the first heat sink part and the second heat sink part are placed together in the operating position;
  (iv) one or more channels formed in the second heat sink part at least partially through one or more of the second projections for carrying a flow of liquid coolant there through; and
  (v) a supply connection and a return connection included with the second heat sink part, wherein both the supply connection and the return connection are in fluid communication with the one or more channels.

10. The cooling system of claim 9 further including a central coolant reservoir, and wherein at least two of the cooling devices are arranged with their respective supply connection and return connection connected to the central coolant reservoir.

11. The cooling system of claim 10 wherein the central coolant reservoir is arranged in or on the rack.

12. The cooling system of claim 9 further including for each cooling device a supply line which connects the supply connection of the respective cooling device to a central coolant supply conduit included in the rack, and a return line which connects the return connection of the respective cooling device to a central coolant return conduit included in the rack.

13. The cooling system of claim 12 wherein the central coolant supply conduit is a rigid conduit fixed in the rack and each supply line includes a flexible portion, and wherein the central coolant return conduit is a rigid conduit fixed in the rack and each return line includes a flexible portion.

14. The cooling system of claim 12 wherein the total length of each combination made up of the supply line to a respective cooling device and the return line from the respective cooling device is approximately equal for each cooling device.

15. An apparatus including:
(a) an electronic component;
(b) a first heat sink part in a heat transfer relationship with the electronic component;
(c) a second heat sink part placed together with the first heat sink part in an operating position;
(d) one or more first projections making up a contact surface of the first heat sink part, and one or more second projections making up a contact surface of the second heat sink part, wherein the contact surface of the first heat sink part mates with the contact surface of the second heat sink part with the one or more first projections interdigited with the one or more second projections when the first heat sink part and the second heat sink part are in the operation position;
(e) one or more channels formed through the second heat sink part at least partially through one or more of the second projections for carrying a flow of liquid coolant there through; and
(f) a supply connection and a return connection included with the second heat sink part, wherein both the supply connection and the return connection are in fluid communication with the one or more channels.

16. The apparatus of claim 15 wherein the first projections and the second projections have beveled, flat side and a trapezoidal cross section.

17. The apparatus of claim 16 wherein the first projections comprise first ribs extending laterally across the first heat sink part and the second projections comprise second ribs extending laterally across the second heat sink part.

* * * * *